United States Patent [19]

Mutzig et al.

[11] Patent Number: 5,276,904
[45] Date of Patent: Jan. 4, 1994

[54] SYSTEM FOR RECEIVING TV SIGNALS RETRANSMITTED BY SATELLITES

[75] Inventors: Jean-Paul Mutzig, Sainte Genevieve des Bois; Claude Cluniat, Verneuil sur Seine; Alain Bert, Gif sur Yvette, all of France

[73] Assignees: Thomson Composants Microondes, Puteaux; Thomson-LGT Laboratoire General des Telecommunications, Conflans Sainte Honorine, both of France

[21] Appl. No.: 646,632
[22] PCT Filed: Jun. 19, 1990
[86] PCT No.: PCT/FR90/00441
  § 371 Date: Feb. 4, 1991
  § 102(e) Date: Feb. 4, 1991
[87] PCT Pub. No.: WO91/00646
  PCT Pub. Date: Jan. 10, 1991

[30] Foreign Application Priority Data

Jul. 4, 1989 [FR] France .................... 89 08967

[51] Int. Cl.⁵ .............................................. H04B 1/16
[52] U.S. Cl. ...................................... 455/3.2; 455/6.2; 455/131; 455/275; 455/282; 455/293
[58] Field of Search ................ 358/86, 188; 455/3.2, 455/282, 293, 131, 6.2, 142, 275, 280, 281, 289, 291

[56] References Cited

U.S. PATENT DOCUMENTS 4,608,710  8/1986  Sugiura .................................. 455/4

FOREIGN PATENT DOCUMENTS 0276144  7/1988  European Pat. Off. .
3226980  1/1984  Fed. Rep. of Germany .
0306719  12/1988  Japan .................................... 455/293

*Primary Examiner*—Reinhard J. Eisenzopf
*Assistant Examiner*—Chi Pham
*Attorney, Agent, or Firm*—Oblon, Spivak, McClelland, Maier & Neustadt

[57] ABSTRACT

A system intended for the simultaneous reception of several TV channels retransmitted by satellites. This system comprises a multi-frequency microwave frequency head, installed in an external unit, whose inputs are connected to the satellite antennas. Wide band demodulation is made possible by a microwave frequency source controlled by a synthesizer. Digital signals transmitted by a link cable ensure programming of the synthesizer and therefore of the selected TV channels. A remodulation in amplitude modulation is performed for supplying signals in the 40–860 MHz band, carried by an existing link cable for terrestrial antennas. The system finds particular application to the simultaneous reception of several TV channels.

21 Claims, 4 Drawing Sheets

SYSTEM FOR RECEIVING TV SIGNALS RETRANSMITTED BY SATELLITES

BACKGROUND OF THE INVENTION

1. Field of the Invention

The present invention relates to a direct demodulation microwave frequency head allowing the reception of television or telecommunications signals retransmitted by a terrestrial satellite. This unique head, located in the vicinity of the parabolic receiving antenna, allows the simultaneous demodulation of several transmission channels from among all the channels available on several satellites. It is connected to the multiplexer of an existing UHF and VHF microwave link receiving antennas and, because of this, uses the existing UHF-VHF down lead to the television receiver, or telecommunications equipment.

2. Discussion of the Background

One of the difficulties associated with the reception of signals retransmitted by satellites is caused by the multiplicity of the forms of retransmitted signals depending on:

the orbital position of the satellites located, for France, between 20° East and 40° West, their carrier band frequency between 11 GHz and 12.8 GHz the type of polarization of the wave transmitted by the satellite which is linearly polarized in the vertical or horizontal direction, or left or right circularly polarized.

This latter characteristic is related to the technology and type of source of illumination of the antenna and is excluded from the scope of the invention but the receiving electronics must still be able to be compatible with all of the covered bandwidth which is, at present, a bandwidth of the order of 1.8 GHz.

According to the prior art, the structure of a satellite TV reception system comprises two subassemblies: an external unit, located for example on the roof of a building, and an internal unit which is often in the form of a cabinet slid under the receiver.

The function of the external unit is:

to pick up the energy transmitted by the satellite by means of an antenna, to amplify the received signal (about $-80$ to $-90$ dBm per channel), to transpose the received signal (bands 10.95 to 11.7, 11.7 to 12.5, 12.5 to 12.75 GHz) into an intermediate frequency band of 950 to 1700 MHz.

The function of the internal unit is:

to select the channel to be received by means of a synthesizer and a frequency converter. A surface wave filter, normally a 480 or 612 MHz filter, allows the elimination of the adjacent channels.

to demodulate the frequency modulated signal by means of:

either a standard frequency discriminator, or a phase locked loop allowing an increase in the sensitivity threshold of the demodulator (gain of 2 to 3 dB approximately).

The essential advantage of this structure is that it minimizes the complexity of the external unit.

In the case of the simultaneous reception of several satellites, each satellite requires a specific receiving antenna. It is therefore necessary to provide, between the external units (antennas and converters) and the internal units (satellite demodulators) as many down leads as there are satellites. When two different polarizations are used simultaneously on a same satellite, it is necessary to provide a switching of the intermediate frequencies, or two antenna down leads per satellite.

In the case of the sequential reception of several satellites, it is possible to simplify the problem by means of a switching box which allows the choosing of "n" outputs from among "p" possibilities and the routing of them to the users concerned. The limit case is of a single user who wishes to sequentially receive one polarization from one satellite at a time. In this case therefore a multi-satellite antenna is necessary which is electrically aimed at the chosen satellite and which has the number of types of microwave frequency sources and of compatible converters.

But in addition, recent television sets have a video frequency picture-in-picture channel which allows the simultaneous observation of what is happening on a main program and on another program for the purpose of recording it.

It is necessary to be able to have the simultaneous availability of:

a main program any program in a picture-in-picture mode a program for the recording which assumes, at least, three independent satellite reception and demodulation channels. In this case, it is necessary to receive all of the signals simultaneously. It is impossible to carry out these functions with a single mono-beam antenna with motorized aiming.

By way of example, in order to receive the principal satellites available in France at the end of 1989, it would be necessary to have:

6 antennas of dimensions adapted to the different powers of the satellites, polarizations which are either linear (H or V) or circular (C+ or C−), receiving signals in different bands, which necessitates the use of three types of microwave frequency, heads, respectively covering the sub-bands of 10.95 to 11.7 GHz, of 11.7 to 12.5 GHz and of 12.5 to 12.75 GHz.

It is necessary to have 10 antenna down leads or a matrix of switches which allows the choosing of three programs from among 10.

It is also necessary to have at least three satellite tuners which are multi-purpose with respect to frequency excursions and with respect to sound subcarriers.

It can therefore be seen that the simultaneous reception of terrestrial UHF-VHF links and of links retransmitted by satellites results in a rather complex and expensive installation.

FIG. 1 shows an example of such an installation.

In this figure, as in all of the others except for FIGS. 8 and 9, the vertical dotted line separates the external unit, to the left of the figure, from the internal unit, to the right.

According to the prior art, a microwave and satellite reception assembly comprises two different, separate systems which join each other only at the level of the TV receiver or of the telecommunications equipment.

The "terrestrial" microwave reception circuit comprises an antenna 1, generally combined for VHF signals (40-250 MHz) and UHF signals (350-860 MHz), a multiplexer 2, and a screened coaxial cable 3, which carries an amplitude modulated signal, in a band included between 40 and 860 MHz. This cable comes down to the receiving equipment in which it feeds, by way of example, a tuner 4 which supplies a principal picture, a tuner 5 which supplies a picture within the previous one and a tuner 6 for recording by video tape recorder.

If such a conventional installation must be modified to receive several channels retransmitted by several satellites, it is necessary to add to it, by way of example:

a parabolic antenna 7, adapted to horizontally and vertically polarized signals, and two converters 8 and 9, one for each type of polarization, a parabolic antenna 10, adapted to circularly polarized signals, and a converter 11.

For each of the converters, 8, 9, 11, a special coaxial cable 12, 13 or 14 transmits a signal which is FM modulated between 950 and 1700 MHz to the internal unit formed from a switching matrix 15 and as many FM demodulators 16, 17, 18 as there are channels transmitted by satellite which are desired to be demodulated simultaneously.

By way of example, if the antenna 7 receives 16 channels and the antenna 10 receives 4 channels, 3 cables 12, 13, 14 and 3 demodulators 16, 17, 18 are necessary for simultaneously demodulating three channels from among 20.

The disadvantage of this system is obvious, it requires a large number of converters 8, 9, 11, each of which does not have a sufficient pass band to cover the bandwidth covered by all of the satellites, and it requires a large number of link cables 12, 13, 14.

With regard to the link cables, it is therefore necessary to install new cables, in addition to the cable 3, which carry signals which are FM modulated at 0.95-1.75 GHz. Because of this, the installation constraints result in high costs.

With regard to the converters, FIG. 2 shows why their pass bandwidth is insufficient. The converters presently used comprise a low noise amplifier 19, which receives the signal coming from the parabolic antenna 7, for example, then a mixer 20 and an output amplifier 21. The mixer 20 also receives the signal coming from a local oscillator 22 which, for practical and economic reasons, is generally a dielectric resonator oscillator, or DRO (Dielectric Resonator Oscillator).

In order for this converter to be multi-band, and adapted to the reception of several satellites, it is necessary for it to have several single frequency or switchable local oscillators 22. At present, the most common solution is a local oscillator having two switchable frequencies, which allows the receiving of only two sub-bands per converter channel.

This solution is insufficient with regard to the number of satellites in orbit, and which are to come, and with regard to the number of channels available for TV retransmission and telecommunications.

SUMMARY OF THE INVENTION

The invention proposes a solution to the multiplication of converters in the external unit and of the link cables to the internal unit, by adapting a microwave frequency head, located in an external unit, integrated with the antenna for example. This receiving head comprises a multi-band converter, operating at a frequency which is programmed by control from the internal unit and a single receiving head can then process 20 to 40 channels. But furthermore, the received signals are demodulated and processed on the spot by the microwave head which supplies signals which are remodulated in amplitude modulation, which allows them to be applied to the multiplexer of VHF-UHF terrestrial microwave link receiving antennas, and the use of the existing single, 40–860 MHz link cable.

The microwave frequency head according to the invention is therefore presented as a device interposed between the parabolic antennas and the multiplexer of the microwave antennas and which does not require any other modification of the existing installation, and in particular no longer requires the installation of numerous special cables for signals which are FM modulated at 0.95 to 1.70 GHz.

More precisely, the invention comprises a system for receiving TV signals retransmitted by satellites, intended for the transmission of at least one channel from among a plurality of channels from at least one antenna, in an external unit, to at least one receiver in an internal unit, this system being characterized in that it comprises, in an external unit, a microwave frequency head which comprises at least:

a microwave frequency demodulation circuit which selects the chosen channel and demodulates it, this circuit being controlled by a single microwave frequency source programmed from the internal unit an amplitude modulating remodulation circuit of the residual side band (MABLR) type which supplies amplitude modulated signals in the band 40–860 Mhz, of the same type as the VHF/UHF signals received by the "terrestrial" transmitting antennas.

BRIEF DESCRIPTION OF THE DRAWINGS

The invention will be better understood by the more detailed description which now follows of two examples, illustrated by the appended figures in which.

DETAILED DESCRIPTION OF THE PREFERRED EMBODIMENTS

Figure 1:
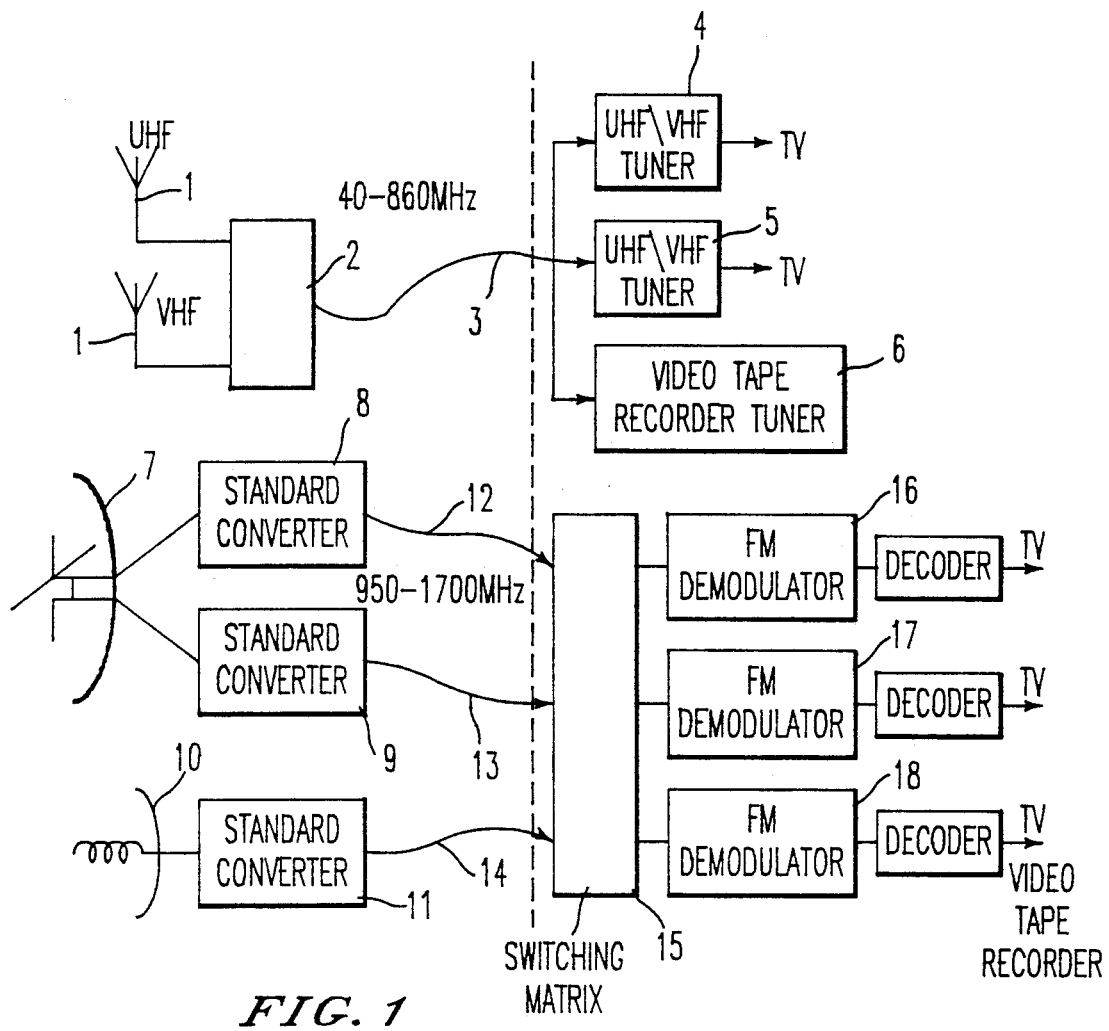
FIGS. 1 and 2 show the system according to the prior art as previously explained.
Figure 2:
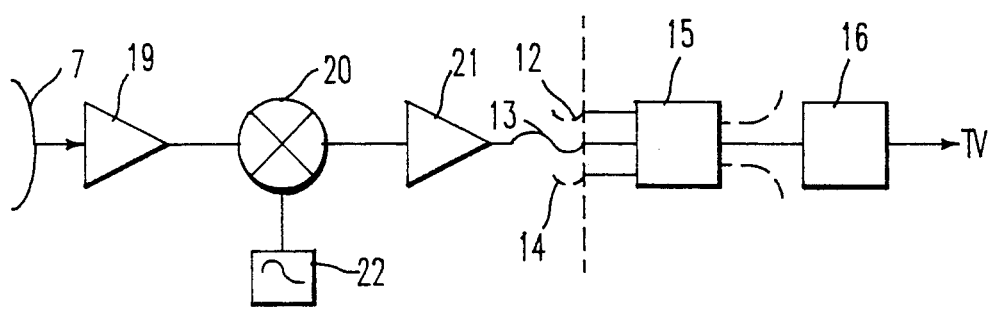
Figure 3:
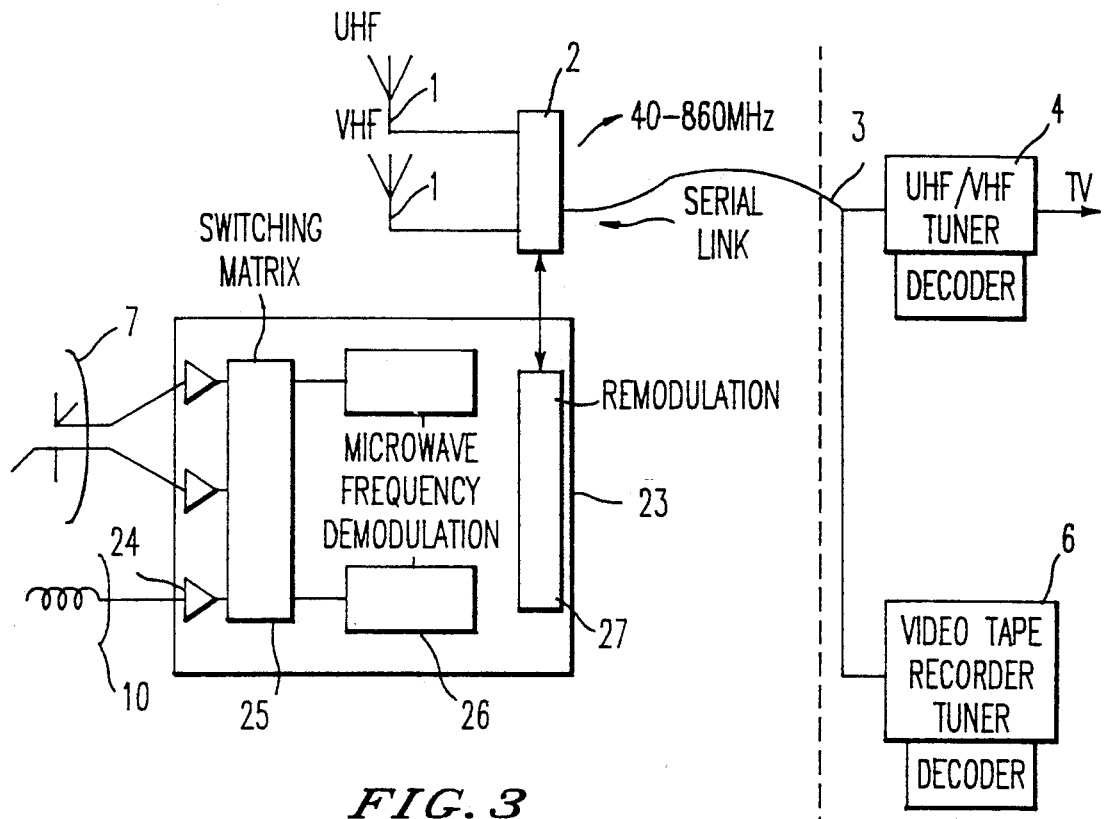
FIG. 3 shows a system of receiving by means of a microwave frequency head according to the invention, allowing the demodulation of at least two satellite channels from among those received by the antennas.

FIG. 3 shows the system for receiving signals retransmitted by satellites according to the invention. The external unit for receiving terrestrial signals comprising the VHF/UHF antennas 1, the multiplexer 2 and the link cable 3 to the internal unit is assumed to already exist, because it is the most common case. If this is not the case, it suffices to install a conventional link cable 3, adapted to 40–860 MHz amplitude modulated signals.

This system of receiving satellite signals is based on a microwave frequency head 23, interposed between the parabolic antenna or antennas 7 and 10, and the multiplexer 2 of the existing installation. The number and type of the parabolic antennas does not limit the extent of the invention and, if there is no multiplexer 2, the link cable 3 is connected directly to the microwave frequency head 23, since one of its purposes is to process the satellite signals in order to make them compatible with the terrestrial signals and pass through the same cable.

The structure of the microwave frequency head 23, which will be described in detail below comprises:

a series of low noise amplifiers 24 each of which receives on its input the signal coming from a parabolic antenna, or from an antenna element, according to the polarization of the signal, a switching matrix allowing the selection of the channel or channels chosen from among those transmitted by the satellite or satellites; this matrix allows the choice of the program from several simultaneously transmitted channels, at least two microwave frequency demodulators 26, a remodulation circuit 27, which converts the FM modulated signals in baseband, 0-6 MHz for example coming from demodulators 26, into amplitude modulated signals in the 40-860 MHz band a 40-860 MHz downward link to the internal unit, an upward link using the same physical medium 3+28, allowing the transmission of the digital data necessary for the selection of the satellite or satellites and of the channels to be demodulated. It also allows a decision to be made on the re-modulation frequency plan, which depends on the microwave channels already received locally.

The invention also covers the case in which there is only one single microwave frequency demodulator 26, but it lacks interest because it is too restrictive, taking account of the number of channels distributed by satellites and of the number of receiving devices which can be served simultaneously, as internal units, by the microwave frequency head according to the invention.

Figure 4:
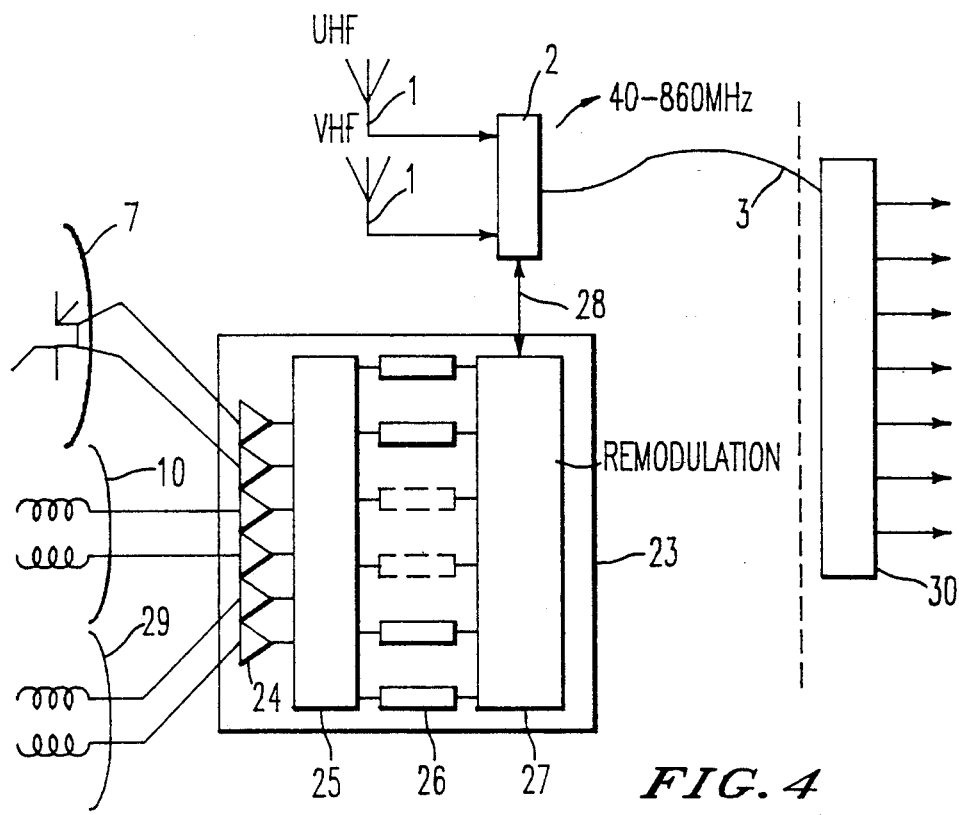
FIG. 4 shows the generalization of the microwave frequency head of FIG. 3 for the reception of N channels from among M channels.

On the contrary, FIG. 4 shows the advantage of the microwave frequency head according to the invention for simultaneously using a large number of channels transmitted by satellites. The number of amplifiers 24 is adapted to the number and to the types of parabolic antennas 7, 10, 29 and to the number of corresponding channels.

But in this case, the switching matrix 25 of FIG. 3 is replaced by a power distributor 25' which transmits all of the channels to a plurality of microwave frequency demodulators 26. This constitutes a solution for the collective service of a building, by means of which a large number of users can each receive a different channel, since all of the channels are demodulated simultaneously. This service is known by the abbreviation SMATV, standing for "Satellite Master Antenna TV".

The number of demodulators 26 can be greater than the number of channels received. If for example:

the antenna 7 receives 8 vertically polarized channels and 8 horizontally polarized channels, the antenna 10 receives 4 channels circularly polarized to the right, the antenna 29 receives under the same conditions as the antenna 10 but from another satellite, 6 amplifiers 24 are necessary, and it is possible to install up to 32 demodulators 26 in the microwave frequency head.

It is good to provide redundancy in the form of a spare channel which, if any one of the principal channels fails, can replace it automatically.

The signals coming from the microwave frequency demodulators 26 are, as in the previous case, applied to a remodulation circuit 27, called MABLR or residual side band amplitude modulation.

The output signals from the head all use the single link cable 3, and are applied by the distributor 30, in the internal unit, to the various receiving devices, either television or telecommunications, each of which decodes the information corresponding to a channel. By way of example, the microwave frequency head according to the invention allows the simultaneous use of up to 20 to 40 channels, in collective reception for a building or a telecommunications center.

The heart of the system is in the microwave frequency demodulator, the function of which is to select a channel and to demodulate the frequency modulated microwave frequency signal, complying with the characteristics required by the standards, that is, rejection of adjacent channels, linearity . . . etc.

Figure 5:
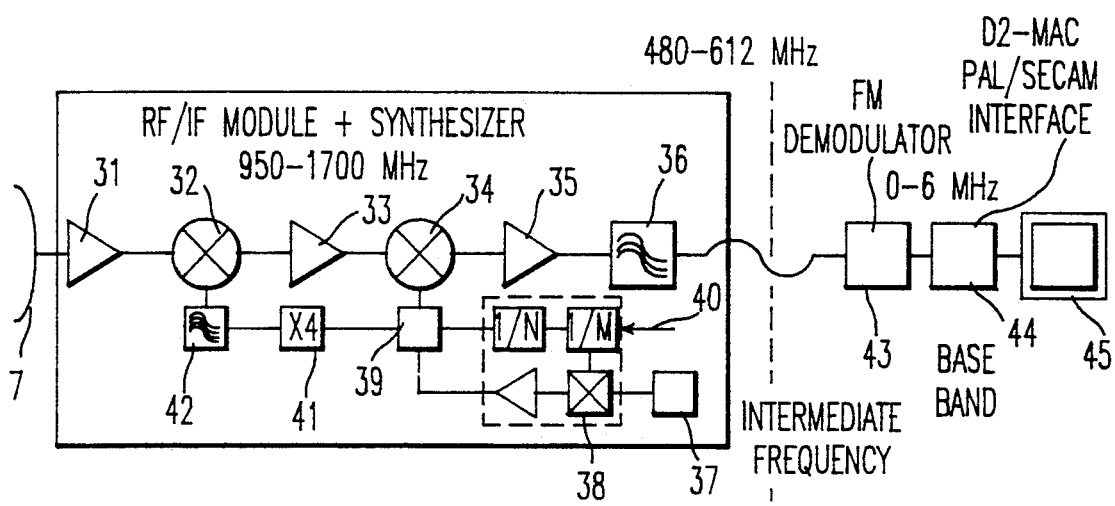
FIGS. 5, 6, and 7 are block diagrams of receiving circuits of the microwave frequency head according to the invention, with different states of integration.
Figure 6:
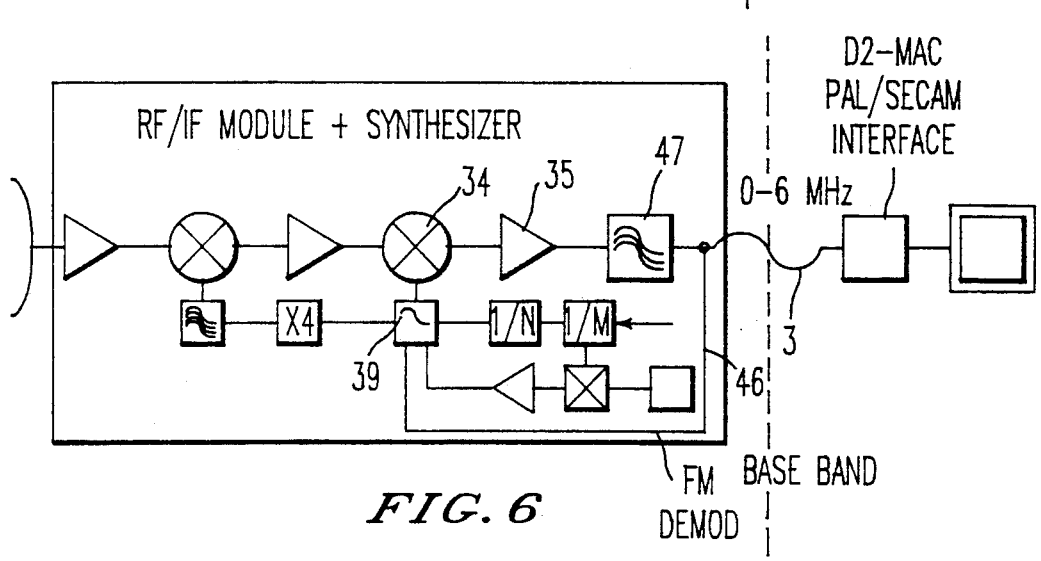
Figure 7:
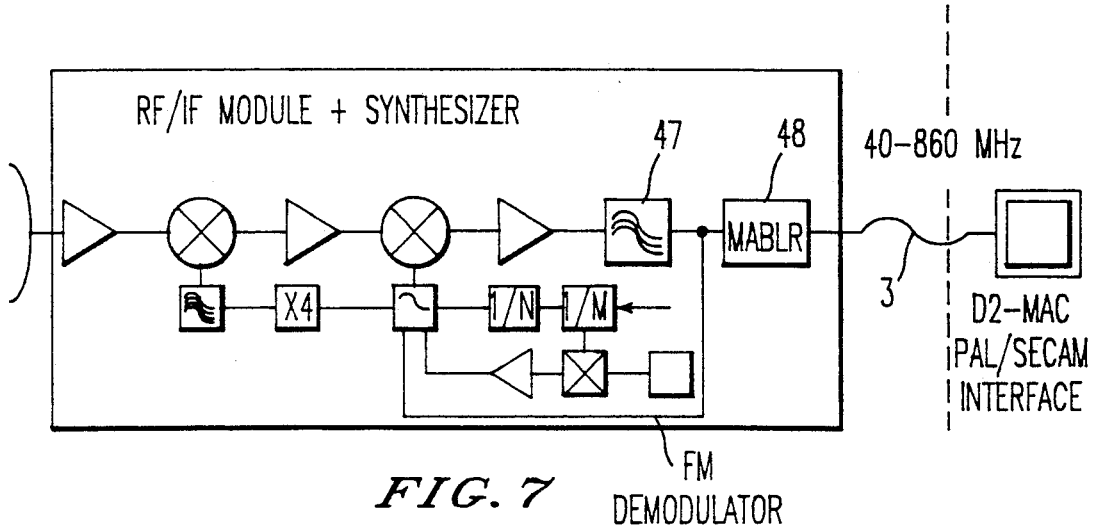

In order to facilitate the understanding of the proposed solution, this microwave frequency demodulator is shown in various stages of integration in FIGS. 5, 6, and 7.

In FIG. 5, the external unit comprises a low noise, multi-band converter and an RF/IF module as well as a synthesizer, all shown in the form of a block diagram. The switching matrix has not been shown, in order to simplify the diagram.

The converter comprises a low noise input amplifier 31 which receives the signals from the antenna 7, a mixer 32 and an output amplifier 33. The converter is controlled by a multi-band oscillator which will be described later. This converter allows the conversion of the entire frequency band of a satellite into a frequency range of 0.95 to 1.70 GHz.

It is followed by an RF/IF module, allowing the transposition of the selected channel to a fixed intermediate frequency (IF), 480 or 612 MHz depending on the manufacturers.

This RF/IF module comprises a mixer 34, an amplifier 35 and an output filter 36, which therefore functions at intermediate frequency.

The converter and the RF/IF module are both controlled from a quartz crystal 37 which, via a synthesizer 38, controls an oscillator 39. The synthesizer 38 is an assembly which is known and available on the market and is controlled on its input 40 by digital data transmitted by the link cable 3, and it allows the selection of a channel, or of N channels from among M channels, by choosing an appropriate frequency. The oscillator 39 directly controls the mixer 34, of the RF/IF module, for example at 2.3 GHz.

But an output of this same oscillator 39 is applied to a multiplier 41, which controls the mixer 32 of the converter through a filter 42. The converter is therefore a multi-band converter since it is controlled by a frequency chosen via the synthesizer 38.

In the present case, a times 4, multiplier has been chosen in order to simplify the description and 2.3 GHz synthesizers are available on the market and these synthesizers correspond well to the mixer 34 of the RF/IF module and, multiplied by 4=9.2 GHz, correspond well to the band of frequencies received by the converter, 11 to 13 GHz.

The microwave frequency demodulator of FIG. 5 transmits on the link cable 3 an intermediate frequency, 480 or 612 MHz, signal which, in the internal unit, is demodulated by the FM demodulator 43, which supplies a base band signal 0-6 Mhz for example. The latter is processed by an interface 44, according to whether the signals are in SECAM, PAL or in D2 MAC for example, before being converted in the TV receiver 45, or the telecommunications equipment. However in the case of a simultaneous reception of several satellite reception bands, several converters and several links between the internal and external units are still necessary.

Among the various possible types of FM demodulators, it is known that a looped oscillator-mixer-amplifier system provides a phase locked loop demodulator with excellent specifications. Now the RF/IF module of FIG. 5 comprises an oscillator 39, a mixer 34 and an amplifier 35 and it suffices to loop them back by a link 46, as shown in FIG. 6, in order to integrate the FM demodulator 43 of FIG. 5 in the microwave frequency head. This configuration is more advantageous because it is simpler and more integrated (the entire system is in the external unit). However, the output filter 47 operates in base band 0-6 MHz; it is therefore different from the filter 36 in FIG. 5 which operates at an intermediate frequency, but, above all, the signals transmitted at 0-6 MHz are sensitive to interference due to the environment of the link cable 3. And several links between external and internal units are still necessary in the case of simultaneous reception.

It is therefore an advantage of the invention that the signal is remodulated, as shown in FIG. 7. The modulator 48 receives the signal in base band, 0-6 MHz, coming from the filter 47, and applies residual side band amplitude modulation (MABLR) to it and it sends, through the link cable 3, signals at 40-860 MHz which are insensitive to interference. This allows the system to be compatible with the existing standard links since the microwave frequency head according to the invention supplies amplitude modulated signals in the 40-860 MHz band, like the conventional VHF-UHF antennas. Furthermore, in the case of a simultaneous reception a single link suffices for transmitting several programs, in 8 MHz steps for example.

Figure 8:
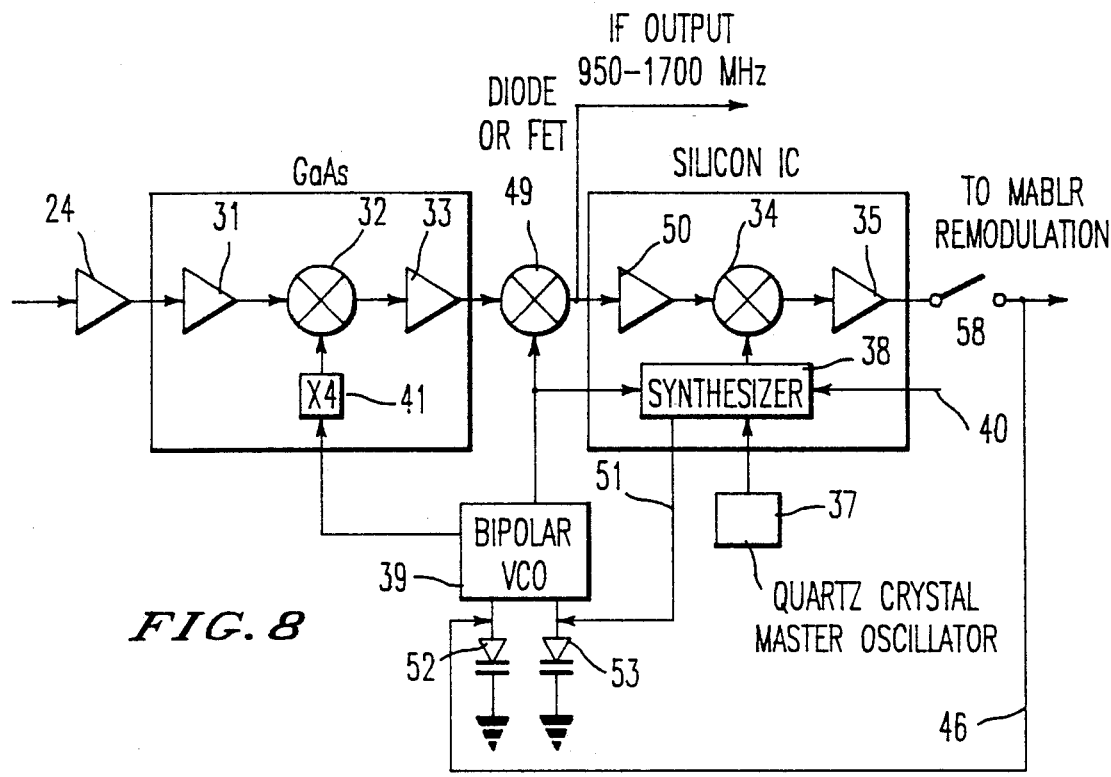
FIG. 8 is the electrical circuit diagram of the wide band converter and of the RF/IF module plus the synthesizer which allows the frequency control of the converter according to the invention.

FIG. 8 shows the electrical circuit diagram of the direct demodulation converter. As in FIGS. 5 to 7, the switching matrix 25 has not been shown in order to simplify the diagram.

It is composed of:

an input stage 24, which is a low noise GaAs heterojunction transistor (Tegfets) amplifier, a frequency converter, compatible with GaAs technology. On a GaAs chip, it comprises an amplifier 31, which also assumes the function of the filter 42 in FIG. 5, a mixer 32 and an output amplifier 33. The multiplier 41 constitutes the local oscillator but, as has been said previously, it is only there because 2.3 GHz synthesizers, for example, are commercially available. The case in which the multiplier is replaced by a local oscillator in the vicinity of 10 GHz and controlled by the synthesizer 38 is of course included in the scope of the invention, a mixing function 49, which is a diode or a field effect transistor, transmits to the RF/IF module the signal coming from the frequency converter, a circuit on silicon, comprising the amplifier 50, the phase comparator 34 and the loop amplifier 35, and the synthesizer 38, which is programmed by digital data transmitted by the upward serial link, a quartz crystal master oscillator 37, exterior to the circuit on silicon, is used as a frequency reference for the synthesizer 38 which, by a link 51, controls a bipolar VCO oscillator 39, comprising two varactor diodes 52 and 53. The outputs of this oscillator 39, at 2.3 GHz for example, are applied to the multiplier 41, to the mixer 49 and to the synthesizer 38, in a feedback loop.

A link 46, which connects the output of the RF/IF module to one of the varactor diodes 52, forms the FM demodulator which has been described previously. From this same output of the RF/IF module, the signals are also applied to the MABLR remodulation circuit 48. This circuit is neither shown nor described in detail as it is known per se; it supplies a residual side band amplitude modulated signal, in the 40-860 MHz band. The MABLR remodulation allows the simultaneous reception of several satellite channels on a single external-internal link.

Figure 9:
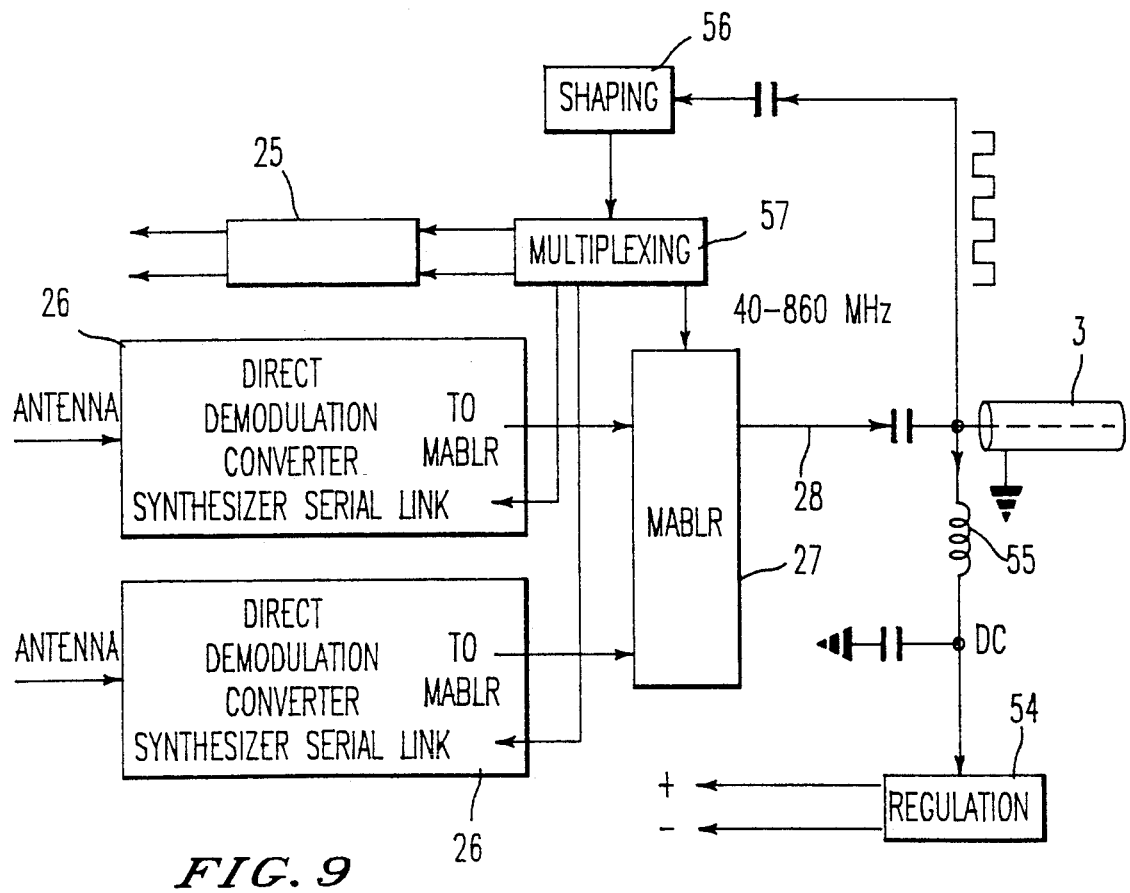
FIG. 9 shows the overall block diagram of the interface between the internal unit and the external unit according to the invention.

FIG. 9 shows the block diagram of the interface between the external units and the internal units; this interface transmits the MABLR remodulated channels, adds energy for feeding the external unit, and carries the digital data for configuring a plurality of VHF/UHF MABLR modulators chosen for the selected channels.

This figure is simplified on the side of the antennas and the switching matrix 25. At least one direct demodulation converter 26 supplies its signals to a MABLR remodulator 27 which uses a standard cable 3 for transmitting 40-860 MHz signals to the internal unit.

But a regulated power supply 54 injects a DC current, smoothed by the LC element 55, onto this same cable 3; the digital data necessary for programming the microwave frequency head according to the invention, coming from the internal unit, are applied to a shaping circuit 56 and then to a multiplexing circuit 57, which distributes them to the switching matrix 25, to the direct demodulation converters 26 and to the MABLR remodulator 27.

An advantage of the microwave frequency head according to the invention is that it processes the signals retransmitted by different satellites and routes them through a 40-860 MHz downward link which is none other than the existing VHF/UHF antenna cable. This is due to the remodulation in MABLR amplitude modulation. However, the microwave frequency head can also be used with receivers fitted with a "satellite" input which receives the signals in the satellite intermediate band 950-1700 MHz. In this case, it suffices to eliminate the FM demodulation, which is carried out by means of a switch in the link 46, and to output before the MABLR remodulation. But in this case the downward link must pass the 40-1700 MHz band. The programming of the microwave frequency head is of course adapted to allow the remote control either of the demodulation of a channel, or of the conversion into satellite intermediate band.

We claim:

1. A microwave frequency head for a system for receiving TV signals retransmitted by satellites, intended for the transmission of at least one chosen channel from among a plurality of channels received from at least one antenna in an external unit, to at least one receiver in an internal unit, the microwave frequency head being formed in the external unit and comprising:

a microwave frequency demodulation circuit which selects the at least one chosen channel and demodulates it, and which is controlled by a single microwave frequency source programmed from the internal unit;

an amplitude modulating remodulation circuit of a residual side band type for receiving signals output from the microwave frequency demodulation circuit and which outputs amplitude modulated signals in a band of 40–860 MHz;

a plurality of low noise amplifiers, wherein there is one low noise amplifier for each output of each of the at least one antenna; and a selection circuit for receiving at an input signals output from the low noise amplifiers, and outputting signals of the at least one chosen channel from among the plurality of channels received by the at least one antenna.

2. The microwave frequency head according to claim 1, wherein the selection circuit is a switching matrix programmed from the internal unit which allows the choice of a program for the simultaneous demodulation of the at least one chosen channel from among the plurality of channels received by the at least one antenna in an individual use.

3. The microwave frequency head according to claim 1, wherein the selection circuit is a power distributor which ensures demodulation of all of the plurality of channels received by the at least one antenna in a collective use.

4. A microwave frequency head for a system for receiving TV signals retransmitted by satellites, intended for the transmission of at least one chosen channel from among a plurality of channels received from at least one antenna in an external unit, to at least one receiver in an internal unit, the microwave frequency head being formed in the external unit and comprising:

a microwave frequency demodulation circuit which selects the at least one chosen channel and demodulates it, and which is controlled by a single microwave frequency source programmed from the internal unit; and an amplitude modulating remodulation circuit of a residual side band type for receiving signals output from the microwave frequency demodulation circuit and which outputs amplitude modulated signals in a band of 40–860 MHz, wherein the microwave frequency demodulation circuit comprises:

a low noise converter, formed by an input amplifier which functions as a filter, a first mixer controlled by a microwave frequency source and an output amplifier;

a diode or field effect transistor intermediate mixer which mixes signals output from the output amplifier and from the microwave frequency source;

an intermediate frequency module, formed by an input amplifier, a phase comparator controlled by a synthesizer and a loop amplifier; and a multi-frequency microwave frequency source, controlled by a quartz crystal and programmed by the synthesizer which allows the selection of a programmed channel.

5. The microwave frequency head according to claim 4, wherein, in the microwave frequency demodulation circuit, the multi-frequency microwave frequency source comprises a voltage controlled oscillator with two inputs and provided with first and second varactor diodes at its two inputs;

wherein a signal output from the synthesizer and controlled by the quartz crystal is applied to the first varactor diode;

wherein the signal output from the output amplifier of the intermediate frequency module is applied to the second varactor diode; and wherein an output signal of the voltage controlled oscillator is applied in parallel to the low noise converter, to the intermediate mixer and as a feedback loop to the synthesizer.

6. The microwave frequency head according to claim 5, further comprising a link between the output of the intermediate frequency module and the oscillator, which constitutes an FM demodulator of the microwave frequency demodulation circuit.

7. The microwave frequency head according to claim 6, wherein a signal frequency demodulated at an output of the intermediate frequency module is applied to the amplitude modulating remodulation circuit.

8. The microwave frequency head according to claim 6, wherein for the purpose of outputting signals in a satellite intermediate band of 950–1700 MHz, the FM demodulator further comprises a switch.

9. The microwave frequency head according to claim 4, wherein programming, from the internal unit, of the at least one chosen channel is carried out by means of digital signals carried by an internal/external link and applied to the synthesizer of the intermediate frequency module.

10. The microwave frequency head according to claim 4, further comprising a single internal/external link, which carries the TV signals as a downward link and digital programming signals as an upward link, the said digital signals being shaped before multiplexing to the synthesizer and the residual side band amplitude remodulation circuit.

11. An antenna system, comprising:

a first antenna means for receiving transmitted terrestrial signals;

at least one second antenna means for receiving a plurality of channel signals retransmitted by satellites;

a frequency demodulator circuit for receiving the plurality of channels signals from the second antenna means, selecting at least one chosen channel signal and demodulating the at least one chosen channel signal;

an amplitude modulating remodulating circuit of a residual side band type for receiving signals output from the frequency demodulator and for outputting amplitude modulated signals;

a multiplexer for receiving signals from the first antenna means and from the amplitude modulating remodulating circuit; and a receiver for receiving signals output from the multiplexer.

12. The antenna system according to claim 11 further comprising:

a plurality of low noise amplifiers, wherein there is one low noise amplifier for each output of each of the at least one second antenna means;

a selection circuit for receiving at an input signals output from the low noise amplifiers, and outputting signals of the at least one chosen channel signal.

13. The microwave frequency head according to claim 12, wherein the selection circuit is a switching matrix which allows the choice of a channel signal for the simultaneous demodulation of the at least one chosen channel signal from among the plurality of channels signals received by the at least one second antenna means in an individual use.

14. The microwave frequency head according to claim 12, wherein the selection circuit is a power distributor which ensures demodulation of all of the plurality of channel signals received by the at least one second antenna means in a collective use.

15. The antenna system according to claim 11, wherein the frequency demodulation circuit comprises:
   a low noise converter, formed by an input amplifier which functions as a filter, a first mixer controlled by a frequency source and an output amplifier;
   a diode or field effect transistor intermediate mixer which mixes signals output from the output amplifier and from the frequency source;
   an intermediate frequency module, formed by an input amplifier, a phase comparator controlled by a synthesizer and a loop amplifier; and
   a multi-frequency frequency source, controlled by a quartz crystal and programmed by the synthesizer which allows the selection of a programmed channel.

16. The antenna system according to claim 15, wherein, in the frequency demodulation circuit, the multi-frequency frequency source comprises a voltage controlled oscillator with two inputs and provided with first and second varactor diodes at its two inputs;
   wherein a signal output from the synthesizer and controlled by the quartz crystal is applied to the first varactor diode;
   wherein the signal output from the output amplifier of the intermediate frequency module is applied to the second varactor diode; and
   wherein an output signal of the voltage controlled oscillator is applied in parallel to the low noise converter, to the intermediate mixer and as a feedback loop to the synthesizer.

17. The antenna system according to claim 16, further comprising a link between the output of the intermediate frequency module and the oscillator, which constitutes an FM demodulator of the frequency demodulation circuit.

18. The antenna system according to claim 17, wherein a signal frequency demodulated at an output of the intermediate frequency module is applied to the amplitude modulating remodulation circuit.

19. The antenna system according to claim 17, wherein for the purpose of outputting signals in a satellite intermediate band of 950–1700 MHz, the FM demodulator further comprises a switch.

20. The antenna system according to claim 15, wherein programming of the at least one chosen channel is carried out by means of digital signals output from the receiver and carried by an internal/external link and applied to the synthesizer of the intermediate frequency module.

21. The microwave frequency head according to claim 11, wherein the at least one chosen channel signal is programmed from programming signals output from the receiver and carried by a signal internal/external link, which carries the channel signals as a downward link and programming signals from the receiver as an upward link.

* * * * *